(12) United States Patent
Son et al.

(10) Patent No.: US 8,912,533 B2
(45) Date of Patent: Dec. 16, 2014

(54) ORGANIC LIGHT EMITTING DISPLAY DEVICE

(75) Inventors: Jung Hyun Son, Seoul (KR); Hoon Kim, Hwaseong-si (KR); Seung Kyu Park, Hwaseong-si (KR); Kie Hyun Nam, Yongin-si (KR); Byung Hee Kim, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/488,006

(22) Filed: Jun. 4, 2012

(65) Prior Publication Data
US 2013/0087770 A1   Apr. 11, 2013

(30) Foreign Application Priority Data

Oct. 6, 2011 (KR) .................. 10-2011-0102027

(51) Int. Cl.
*H01L 51/52* (2006.01)
*H01L 27/32* (2006.01)

(52) U.S. Cl.
CPC ....... *H01L 51/5243* (2013.01); *H01L 2251/558* (2013.01); *H01L 51/5246* (2013.01); *H01L 27/3244* (2013.01); *H01L 51/5259* (2013.01)
USPC ................................. 257/40; 257/E27.119

(58) Field of Classification Search
CPC ........... H01L 27/3244; H01L 51/5265; H01L 51/0085; H01L 2251/5315; H01L 27/1214
USPC ............................................ 257/40, E27.119
See application file for complete search history.

(56) References Cited

U.S. PATENT DOCUMENTS

2005/0161740 A1* 7/2005 Park et al. .................... 257/347

FOREIGN PATENT DOCUMENTS

| JP | 2006-85920 | | 3/2006 |
|---|---|---|---|
| KR | 10-2003-0073171 | | 9/2003 |
| KR | 1020030073171 | * | 9/2003 |
| KR | 10-2007-0033228 | | 3/2007 |
| KR | 10-2007-0067506 | | 6/2007 |

* cited by examiner

*Primary Examiner* — Tony Tran
(74) *Attorney, Agent, or Firm* — Robert E. Bushnell, Esq.

(57) ABSTRACT

An organic light emitting display device which includes a base member; an organic light emitting display unit disposed on the base member and configured to generate an image; a sealing layer configured to seal the organic light emitting display unit; a capping substrate disposed on the sealing layer and having a plurality of metal layers, one of the metal layers being in contact with the sealing layer and having at least one groove; and a moisture absorbent provided in the groove.

13 Claims, 4 Drawing Sheets

ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 6 Oct. 2011 and there duly assigned Serial No. 10-2011-0102027.

BACKGROUND OF THE INVENTION

1. Field of the Invention

Embodiments relate to an organic light emitting display device, and more particularly, relate to an organic light emitting display device having a capping substrate.

2. Description of the Related Art

As compared with a liquid crystal display device, an organic light emitting display device using organic light emitting elements may be characterized in that a response speed is faster, a viewing angle is wider due to a spontaneous light emitting property, and luminance is higher. The organic light emitting elements may be formed of two opposite electrodes and a light emitting layer interposed between the two electrodes and including an organic substance.

The organic light emitting elements may be sensitive to moisture. Upon contact with moisture, the organic light emitting elements may be easily degraded. If moisture is diffused into an organic substance layer, an electrochemically charge transfer reaction may be generated at the interface between a pixel electrode or an opposite electrode and the organic substance layer, so that an oxide is generated. The pixel electrode or opposite electrode and the organic substance layer may be separated by the oxide. This may mean that dark spot is generated. Accordingly, a life of the organic light emitting elements may be shortened.

To solve the above-described problem, a conventional organic light emitting display device may have a capping substrate for protecting an organic light emitting element from moisture.

SUMMARY OF THE INVENTION

One aspect of embodiments of the inventive concept is directed to provide an organic light emitting display device comprising a base member; an organic light emitting display unit disposed on the base member and configured to generate an image; a sealing layer configured to seal the organic light emitting display unit; a capping substrate disposed on the sealing layer and having a plurality of metal layers, one of the metal layers being in contact with the sealing layer and having at least one groove; and a moisture absorbent provided in the groove.

In this embodiment, the plurality of metal layers comprises a first metal layer; a second metal layer exposed at the outside; and at least one third metal layer provided between the first metal layer and the second metal layer, the first metal layer being the metal layer being in contact with the sealing layer.

In this embodiment, the first metal layer includes stainless steel, titanium, or titanium alloy.

In this embodiment, the second metal layer includes the same matter as the first metal layer.

In this embodiment, the third metal layer includes aluminum or aluminum alloy.

In this embodiment, a thickness of the third metal layer is thicker than a thicknesses of the first and second metal layers.

In this embodiment, the at least one groove has a closed line shape formed along the outside of the first metal layer on a plane.

In this embodiment, the at least one groove is formed to penetrate the first metal layer.

In this embodiment, the third metal layer includes at least one groove formed to penetrate the third metal layer, the at least one groove of the third metal layer being aligned with the at least one groove of the first metal layer.

In this embodiment, the organic light emitting display unit emits the image in a direction of the base member.

Another aspect of embodiments of the inventive concept is directed to provide an organic light emitting display device comprising a base member in which a display area including a plurality of pixel regions and a non-display region adjacent to at least a part of the display area are defined; an organic light emitting element including a first electrode, a second electrode opposite to the first electrode, and an organic light emitting layer interposed between the first electrode and the second electrode, the organic light emitting element being provided at the plurality of pixel regions, respectively; a capping substrate disposed to be opposite to the base member and including a plurality of metal layers being stacked sequentially, one of the metal layers, at least adjacent to the base member, having at least one groove; a moisture absorbent provided in the groove; and a sealing member provided between the base member and the capping substrate to seal the organic light emitting element.

In this embodiment, the organic light emitting display device further comprises a switching element configured to provide a driving voltage to the first electrode, the switching element being provided at each of the plurality of pixel regions, respectively.

In this embodiment, the first electrode, the organic light emitting layer, and the second electrode are sequentially stacked from the base member, the second electrode being a reflective electrode reflecting a light, generated by the organic light emitting layer, in a direction of the base member.

In this embodiment, the metal layer adjacent to the base member is defined as a first metal layer, and the plurality of metal layers comprises the first metal layer; a second metal layer exposed at the outside; and at least one third metal layer provided between the first metal layer and the second metal layer.

In this embodiment, the first metal layer includes stainless steel, titanium, or titanium alloy, and the second metal layer includes the same matter as the first metal layer.

In this embodiment, the third metal layer includes aluminum or aluminum alloy.

In this embodiment, a thickness of the third metal layer is thicker than thicknesses of the first and second metal layers.

In this embodiment, the non-display region surrounds the display area on a plane, and the groove is disposed at a region corresponding to the non-display region and has a closed line shape, on a plane.

In this embodiment, the groove is formed to penetrate the first metal layer.

In this embodiment, the third metal layer includes at least one groove formed to penetrate the third metal layer, the groove of the third metal layer being aligned to the groove of the first metal layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
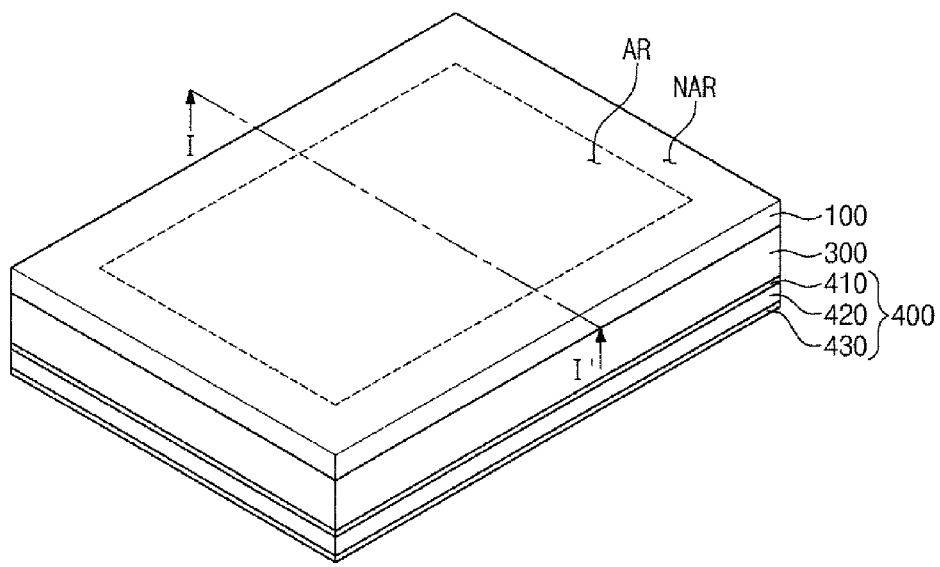
FIG. 1 is a perspective view of an organic light emitting display device according to an embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
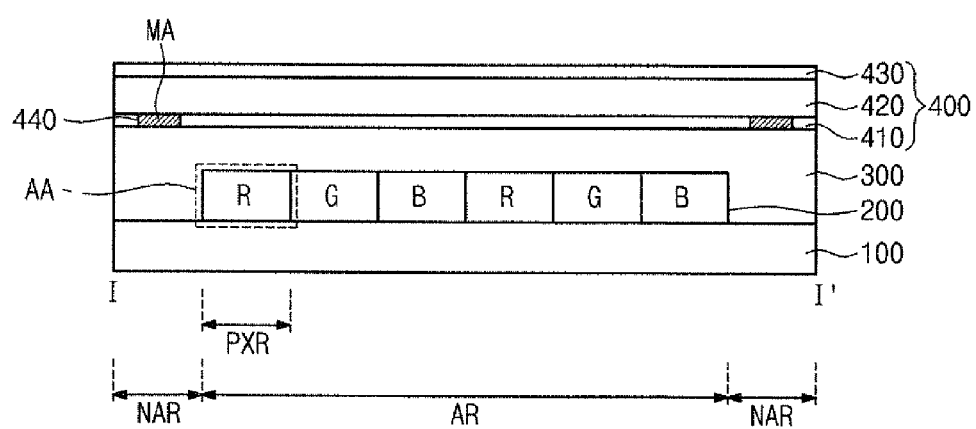
FIG. 2 is a cross-sectional view taken along a line I-I' in FIG. 1.
Figure 3:
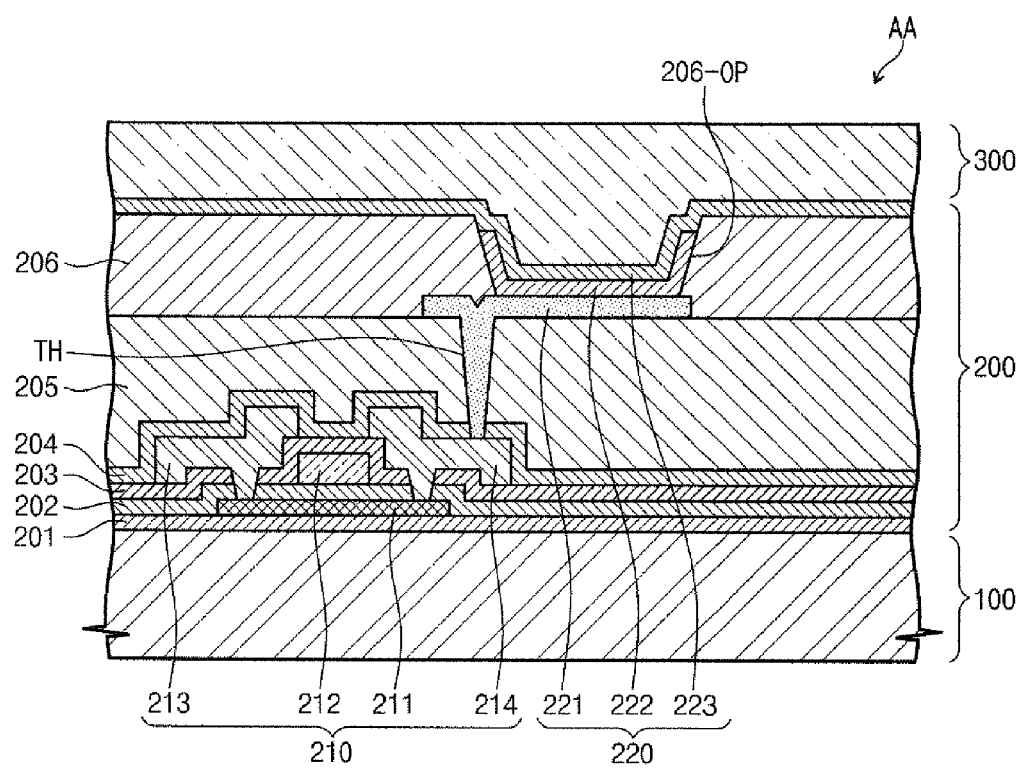
FIG. 3 is an enlarged cross-sectional view of a part of FIG. 2.
Figure 4:
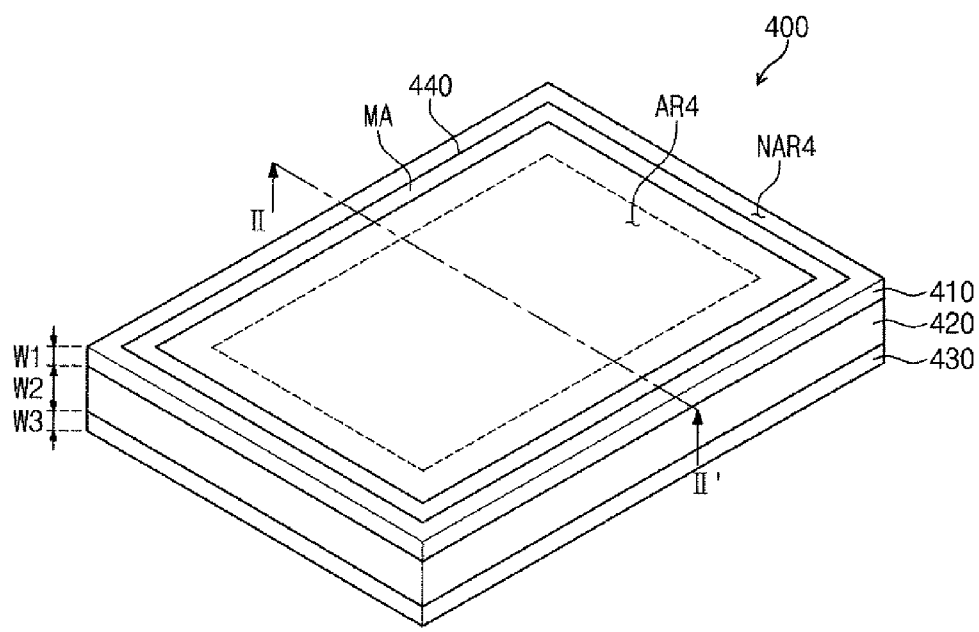
FIG. 4 is a cross-sectional view of a capping substrate illustrated in FIG. 1.
Figure 5:
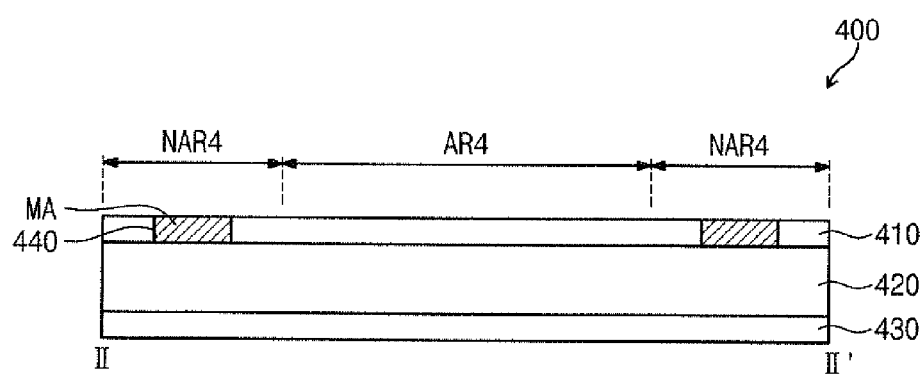
FIG. 5 is a cross-sectional view taken along a line II-IF in FIG. 4.

FIG. 1 is a perspective view of an organic light emitting display device according to an embodiment of the inventive concept. FIG. 2 is a cross-sectional view taken along a line I-I' in FIG. 1. FIG. 3 is an enlarged cross-sectional view of a part AA of FIG. 2. FIG. 4 is a cross-sectional view of a capping substrate illustrated in FIG. 1. FIG. 5 is a cross-sectional view taken along a line II-II' in FIG. 4.

As illustrated in FIGS. 1 and 2, an organic light emitting display device may include a base member (or substrate) 100, an organic light emitting display unit 200, a sealing layer 300, and a capping substrate 400.

The base member 100 may include a display area AR and a non-display area NAR adjacent to the display area AR. The display area AR may be an area where the organic light emitting display unit 200 is disposed. The display area AR may be divided into a plurality of pixel regions PXR.

The base member 100 can be formed of glass, plastic such as acrylic, and the like. It may be desirable to use a tempered glass or a tempered plastic such as polycarbonate as the base member 100. However, the inventive concept is not limited thereto.

The organic light emitting display unit 200 may be provided on one surface of the base member 100. The organic light emitting display unit 200 may spontaneously emit a light according to the mechanism that negative and positive charges injected via two electrodes are combined within an organic substance.

The organic light emitting display unit 200 may be classified into a passive matrix type and an active matrix type according to whether switching elements are included or not.

Below, an active matrix type organic light emitting display unit 200 will be described with reference to FIG. 3.

The organic light emitting display unit 200 may include a switching element 210 provided on the base member 100 and an organic light emitting element 220 connected with the switching element 210. The switching element 210 and the organic light emitting element 220 may be formed at each of the plurality of pixel regions PXR.

For ease of description, one switching element 210 and one organic light emitting element 220 corresponding to one pixel region PXR are illustrated in FIG. 3. In this embodiment, each of the plurality of pixel regions PXR may include such a construction as illustrated in FIG. 3. Adjacent pixel regions PXR may further include different color filters (not shown) or different organic light emitting matters to emit lights of different colors.

The switching element 210 may be a thin film transistor. Below, the switching element 210 will be more fully described on the basis of a thin film transistor.

A buffer layer 201 may be formed on one surface of the base member 100 to level a surface of the base member 100 and to prevent infiltration of impurities. The buffer layer 201 may be formed of silicon oxide ($SiO_x$) or silicon nitride ($SiN_x$). The buffer layer 201 can be removed on a case-by-case basis.

An active layer 211 of the switching element 210 may be formed on the buffer layer 201 using a semiconductor substance. A gate insulation film 202 may be formed on the buffer layer 201 to cover the active layer 211. A gate electrode 212 may be provided on the gate insulation film 202. An interlayer insulation film 203 may be formed on the gate insulation film 202 to cover the gate electrode 212. A source electrode 213 and a drain electrode 214 may be provided on the interlayer insulation film 203. A protection film 204 and a planarization film 205 may be formed sequentially on the interlayer insulation film 203 to cover the source electrode 213 and the drain electrode 214.

The gate insulation film 202, the interlayer insulation film 203, the protection film 204, and the planarization film 205 may be formed of an insulation substance. Alternatively, the gate insulation film 202, the interlayer insulation film 203, the protection film 204, and the planarization film 205 may be formed of a single-layer structure or a multi-layer structure including a non-organic substance, an organic substance, or a compound of the non-organic substance and the organic substance.

The organic light emitting element 220 may be provided on the planarization film 205. Below, the organic light emitting element 220 will be more fully described.

A first electrode 221 may be formed on the planarization film 205. The first electrode 221 may be an anode electrode. The first electrode 221 may be connected to the drain electrode 214 via a through hole TH.

A pixel define layer 206 may be formed on the planarization film 205, and may include an opening portion 206-OP formed to expose the first electrode 221. The organic light emitting layer 222 connected to the first electrode 221 may be formed at the opening portion 206-OP. The second electrode 223 may be provided on the pixel define layer 206 to be connected with the organic light emitting layer 222. The second electrode 223 may be a cathode electrode.

The organic light emitting element 220 may have a bottom emission structure enabling an image to be emitted in a direction of base member 100. In this case, the first electrode 221 may be a transparent electrode, and the second electrode 223 may be a reflective electrode reflecting a light generated by the organic light emitting layer 222.

The first electrode 221 may be formed of a transparent metal oxide substance such as indium tin oxide (ITO), indium zinc oxide (IZO), tin oxide ($SnO_2$), and zinc oxide (ZnO). The second electrode 223 may be formed of lithium (Li), magnesium (Mg), aluminum (Al), aluminum-lithium (Al—Li), calcium (Ca), magnesium-indium (Mg—In), magnesium-Argentum (Mg—Ag), or a compound thereof.

The organic light emitting layer 222 may be formed of an organic small molecular substance or an organic polymer substance. The organic small molecular substance may include copper phthalocyanine (CuPc), N, N-di(naphfhalene-1-yl)-N, N'-di(naphthalene-1-yl)-N,N'-diphenyl-benzidine (NPB), tris-8-hydroxyquinoline aluminum (Alq3), and the like.

The organic polymer substance may include a Poly-Phenylenevinylene polymer and a Polyfluorene polymer.

Although not shown in FIG. 3, other than the organic light emitting layer 222, at least one or more layers selected from a group of a hole injection layer, a hole carrier layer, a hole stop layer, an electron carrier layer, and an electron injection layer may be further included between the first electrode 221 and the second electrode 223.

The sealing layer 300 may be provided on one surface of second electrode 223 opposite the base member 100 to seal the organic light emitting display unit 200. The sealing layer 300 may be formed to have a sheet shape.

The sealing layer 300 may include thermosetting resin or UV resin (photopolymer).

Epoxy resin can be used as the thermosetting resin. For example, the epoxy resin may be bisphenol-A epoxy resin, bisphenol-F epoxy resin, cycloaliphatic epoxy resin, hydrogenated bisphenol epoxy resin, aromatic epoxy resin, Novolac epoxy resin, dicyclopentadiene epoxy resin, or the like.

The sealing layer 300 including the thermosetting resin may further comprise heat curing agent, hardening accelerant, antioxidant, coupling agent, etc.

The aromatic epoxy resin or the cycloaliphatic epoxy resin may be used as the UV resin.

The sealing layer 300 including the UV resin may further comprise photoinitiator, inorganic filler, photoacid generator, coupling agent, space, etc.

As shown in FIGS. 1 and 2, the capping substrate 400 may be coupled with the sealing layer 300 to be opposite to the base member 100. The capping substrate 400 may include a plurality of metal layers. The capping substrate 400 including the plurality of metal layers may be formed by stacking, rolling, and heating surface-treated metal layers.

In this embodiment, the metal layers may include a first metal layer 410 being in contact with the sealing layer 300, a third metal layer 430 exposed at the outside, and a second metal layer 420 disposed between the first and third metal layers 410 and 430.

In FIGS. 1, 2, 4 and 5, there is illustrated the case that a capping substrate includes one first metal layer 410. However, the inventive concept is not limited thereto. For example, the number of first metal layers can be changed.

The first metal layer 410 and the third metal layer 430 constituting the outer of the capping substrate 400 may be formed of stainless steel, titanium, or titanium alloy. Since acid resistance, alkali resistance, and corrosion resistance of such matters are good as compared with other matters, the durability of the capping substrate 400 may be improved.

Herein, the first and second metal layers 410 and 430 may include the same matter to reduce bending of the capping substrate 400.

The second metal layer 420 may include aluminum or aluminum alloy having a high heat transmission rate as compared with other matters.

Desirably, as shown in FIG. 4, a thickness W2 of the second metal layer 420 may be thicker than a thickness W1 of the first metal layer 410 and a thickness W3 of the third metal layer 430. Additionally, thickness W2 may be greater than or equal to the combined thicknesses W1 and W3. Thus, it is possible to implement a light capping substrate 400 with a good radiation property.

As illustrated in FIGS. 2, 4, and 5, the capping substrate 400 may have a groove 440 where a moisture absorbent MA is deposited. The groove 440 may be formed at one (e.g., the first metal layer 410) of the plurality of metal layers 410, 420, and 430. The groove 440 may be formed by a chemical etching method, a laser drill method, a sandblast method, or the like.

As illustrated in FIGS. 4 and 5, the groove 440 may be a closed line shape formed along the outside, in the non-display area NAR4 of the first metal layer 410 on a plane. As the groove 440 has the closed line shape, moisture absorbent MA filled in the groove 440 may prevent moisture from being infiltrated from all sides of the organic light emitting display device. A shape of the groove 440 is not limited to the closed line shape. In the event that the first metal layer 410 has a tetragonal shape as illustrated in FIG. 4, the capping substrate 400 can have four separated grooves (not shown) formed along four sides of the first metal layer 410.

Further, as illustrated in FIGS. 4 and 5, the groove 440 can be formed at a non-display area NAR4 of the first metal layer 410, corresponding to the non-display area NAR (FIG. 2) of the base member 100 on a plane, surrounding display area AR4 of the first metal layer 410.

Further, as illustrated in FIGS. 4 and 5, the groove 440 can be formed to penetrate, or perforate, the first metal layer 410. In other words, a depth of the groove 440 may correspond to a thickness W1 of the first metal layer 410. The capping substrate 400 including the plurality of metal layers 410, 420, and 430 may be easy to control a depth of the groove 440. When the groove 440 is formed by the chemical etching method, the laser drill method, the sandblast method, or the like, a specific variation may arise at an interface being in contact with the plurality of metal layers 410, 420, and 430.

It is assumed that the groove 440 is formed by the laser drill method. If the first metal layer 410 and the second metal layer 420 are formed of stainless steel and aluminum, respectively, a reaction of a laser beam may differentiate at an interface of the first and second metal layers 410 and 420 because a reaction of the laser beam is different according to metal matters. A configuration of controlling a laser beam of a laser drill may detect variations of the laser beam and the metal layers 410 and 420 to control an output of the laser beam.

Figure 7:
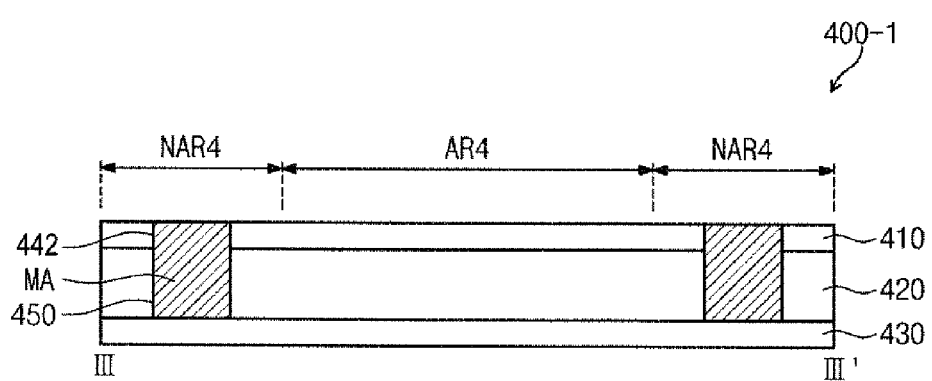
FIG. 7 is a cross-sectional view taken along a line III-III' of FIG. 6.

As a result, the capping substrate 400 including the plurality of metal layers 410, 420, and 430 may be easy to form the groove 440 having a depth which corresponds to a thickness W1 of the first metal layer 410 or to a sum of a thickness W1 of the first metal layer 410 and a thickness W2 of the second metal layer 430 (see FIG. 7).

The moisture absorbent MA absorbing moisture penetrated from the outside may be disposed in the groove 440 provided in the capping substrate 400. It may be desirable to form the moisture absorbent MA so as to sufficiently fill the groove 440. The moisture absorbent MA may be formed of calcium oxide (CaO), selenium oxide (SeO), or a mixture of metal oxide and acrylic resin. For example, a liquefied moisture absorbent MA may be hardened by coating the liquefied moisture absorbent MA at the groove 440 and heating a resultant structure.

Although not shown in any of the figures, the moisture absorbent MA can be included in a matter constituting the sealing layer 300. Further, the moisture absorbent MA can be disposed at a groove which is further formed at the sealing layer 300.

Figure 6:
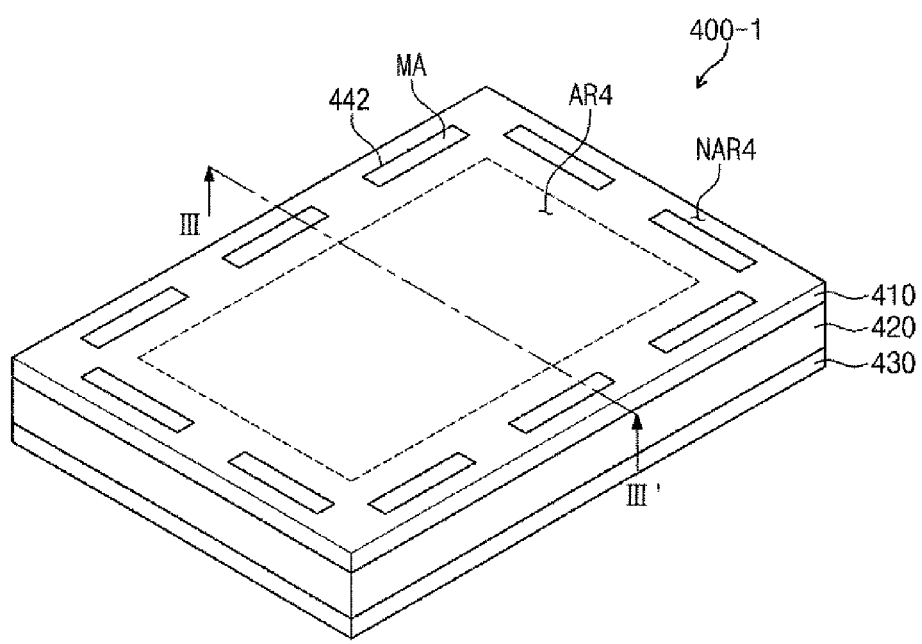
FIG. 6 is a perspective view of an organic light emitting display device according to another embodiment of the inventive concept.

FIG. 6 is a perspective view of an organic light emitting display device according to another embodiment of the inventive concept. FIG. 7 is a cross-sectional view taken along a line III-III' of FIG. 6. In FIGS. 6 and 7, constituent elements which are substantially identical to those in FIGS. 1 through 5 may be marked by the same reference numerals, and description thereof is thus omitted.

An organic light emitting display device according to another embodiment of the inventive concept may include a capping substrate 400-1 having at least one groove 442. The capping substrate 400-1 may include a first metal layer 410, at least one second metal layer 420, and a third metal layer 430. At least one (e.g., the first metal layer 410) of the first through third metal layers 410 through 430 may include the groove 442.

The capping substrate 400 may include a plurality of grooves 442, which are formed at a non-display area NAR4 of the first metal layer 410 corresponding to the non-display area NAR (FIG. 2) of the base member 100. The grooves 442 may be disposed on the non-display area NAR4 of the first metal layer 410 to be spaced apart by the same interval.

The grooves 442 may be formed to penetrate, or perforate, the first metal layer 410.

The second metal layer 420 may include at least one groove 450 which is aligned to the at least one groove 442 of the first metal layer 410. As illustrated in FIG. 7, the groove 450 may be formed to penetrate, or perforate, the second metal layer 420.

Thus, the amount of moisture absorbent MA disposed at the same area of the capping substrate 400-1 may increase. This may mean that moisture infiltrated toward the inside of the organic light emitting display device is efficiently prevented.

Radiation and corrosion resistance of the organic light emitting display device may be improved by the capping substrate having a plurality of metal layers. Further, the capping substrate may have a groove penetrating at least one of the metal layers, the moisture absorbent may be disposed in the groove, and moisture infiltrated into the organic light emitting display unit may be prevented by the moisture absorbent disposed in the groove.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An organic light emitting display device comprising:
   a base member;
   an organic light emitting display unit disposed on the base member and configured to generate an image;
   a sealing layer configured to seal the organic light emitting display unit, the sealing layer overlapping the organic light emitting display unit;
   a capping substrate disposed on the sealing layer and having a first metal layer, a second metal layer and a third metal layer, each of the first second and third metal layers overlapping the organic light emitting display unit, the first metal layer being in contact directly with the sealing layer and having at least one groove, wherein the first metal layer includes stainless steel, titanium, or titanium alloy, the second metal layer includes aluminum or aluminum alloy and the third metal layer includes the same matter as the first metal layer; and a moisture absorbent provided in the groove, wherein the second metal layer is disposed between the first metal layer and the third metal layer, and a heat transmission rate of the second metal layer is higher than a heat transmission rate of each of the first and third metal layers.

2. The organic light emitting display device of claim 1, wherein a thickness of the second metal layer is thicker than a thicknesses of the first and third metal layers.

3. The organic light emitting display device of claim 1, wherein the at least one groove has a closed line shape formed along the outside of the first metal layer on a plane.

4. The organic light emitting display device of claim 1, wherein the at least one groove is formed to penetrate the first metal layer.

5. The organic light emitting display device of claim 4, wherein the second metal layer includes at least one groove formed to penetrate the second metal layer, the at least one groove of the second metal layer being aligned with the at least one groove of the first metal layer and includes the moisture absorbent.

6. The organic light emitting display device of claim 1, wherein the organic light emitting display unit emits the image in a direction of the base member.

7. An organic light emitting display device comprising:
   a base member in which a display area including a plurality of pixel regions and a non-display region adjacent to at least a part of the display area are defined;
   an organic light emitting element including a first electrode, a second electrode opposite to the first electrode, and an organic light emitting layer interposed between the first electrode and the second electrode, the organic light emitting element being provided at each of the plurality of pixel regions, respectively;
   a capping substrate disposed to be opposite to the base member and including a first metal layer, a second metal layer and a third metal layer being stacked sequentially such that each of the first, second and third metal layers overlaps the organic light emitting element, the first metal layer having at least one groove, wherein the first metal layer includes stainless steel, titanium, or titanium alloy, the second metal layer includes aluminum or aluminum alloy and the third metal layer includes the same matter as the first metal layer;
   a moisture absorbent provided in the groove; and
   a sealing member provided between the base member and the capping substrate to seal the organic light emitting element, the sealing member being in contact directly with the first metal layer,
   wherein a heat transmission rate of the second metal layer is higher than a heat transmission rate of each of the first and third metal layers.

8. The organic light emitting display device of claim 7, further comprising:
   a switching element configured to provide a driving voltage to the first electrode, the switching element being provided at each of the plurality of pixel regions, respectively.

9. The organic light emitting display device of claim 7, wherein the first electrode, the organic light emitting layer, and the second electrode are sequentially stacked from the base member, the second electrode being a reflective electrode reflecting a light, generated by the organic light emitting layer, in a direction of the base member.

10. The organic light emitting display device of claim 7, wherein a thickness of the second metal layer is thicker than a thicknesses of the first and third metal layers.

11. The organic light emitting display device of claim 7, wherein the non-display region surrounds the display area on a plane, and the groove is disposed at a region corresponding to the non-display region and has a closed line shape, on a plane.

12. The organic light emitting display device of claim 11, wherein the groove is formed to penetrate the first metal layer.

13. The organic light emitting display device of claim 12, wherein the second metal layer includes at least one groove formed to penetrate the second metal layer, the groove of the second metal layer being aligned with the groove of the first metal layer and includes the moisture absorbent.

* * * * *